United States Patent
Fernandes et al.

(10) Patent No.: US 10,905,030 B1
(45) Date of Patent: Jan. 26, 2021

(54) LIQUID-COOLING WITHIN AN AIR-COOLED FACILITY

(71) Applicant: Facebook, Inc., Menlo Park, CA (US)

(72) Inventors: John Edward Fernandes, Fremont, CA (US); Jacob Na, Los Gatos, CA (US)

(73) Assignee: Facebook, Inc., Menlo Park, CA (US)

(*) Notice: Subject to any disclaimer, the term of this patent is extended or adjusted under 35 U.S.C. 154(b) by 0 days.

(21) Appl. No.: 16/521,461

(22) Filed: Jul. 24, 2019

(51) Int. Cl.
  *H05K 7/20* (2006.01)
  *H05K 7/14* (2006.01)

(52) U.S. Cl.
  CPC ....... *H05K 7/20781* (2013.01); *H05K 7/1488* (2013.01); *H05K 7/20263* (2013.01); *H05K 7/20272* (2013.01); *H05K 7/20281* (2013.01); *H05K 7/20727* (2013.01); *H05K 7/20836* (2013.01)

(58) Field of Classification Search
  CPC ....... H05K 7/20272–7/20281; H05K 7/20645; H05K 7/207; H05K 7/20781; H05K 7/20836
  See application file for complete search history.

(56) References Cited

U.S. PATENT DOCUMENTS

| | | | | |
|---|---|---|---|---|
| 7,286,351 B2* | 10/2007 | Campbell | .......... | H05K 7/20745 165/185 |
| 7,318,322 B2* | 1/2008 | Ota | .......... | H05K 7/20781 62/259.2 |
| 7,349,213 B2* | 3/2008 | Campbell | .......... | H05K 7/2079 165/104.33 |
| 7,609,519 B2* | 10/2009 | Campbell | .......... | H05K 7/2079 165/104.33 |
| 7,905,096 B1* | 3/2011 | Campbell | .......... | H05K 7/20836 62/259.2 |
| 8,248,801 B2* | 8/2012 | Campbell | .......... | H05K 7/2079 361/701 |
| 8,297,069 B2* | 10/2012 | Novotny | .......... | H05K 7/20836 62/259.2 |
| 8,472,182 B2* | 6/2013 | Campbell | .......... | H05K 7/20781 361/679.49 |
| 8,736,288 B2* | 5/2014 | Lewinnek | .......... | G01R 31/2877 324/750.03 |
| 9,852,963 B2* | 12/2017 | Shedd | .......... | F25B 23/006 |
| 10,136,554 B2* | 11/2018 | Chainer | .......... | H05K 7/2029 |
| 10,162,396 B2* | 12/2018 | Cui | .......... | G06F 1/206 |
| 10,225,957 B2* | 3/2019 | Gao | .......... | H05K 7/20172 |
| 10,238,011 B1* | 3/2019 | Cui | .......... | H05K 7/20836 |
| 10,485,143 B2* | 11/2019 | Gao | .......... | H05K 7/20772 |
| 10,638,641 B2* | 4/2020 | Franz | .......... | H05K 7/20236 |
| 10,667,437 B2* | 5/2020 | Gao | .......... | H05K 7/20781 |
| 10,674,635 B2* | 6/2020 | Gao | .......... | H05K 7/20745 |
| 2007/0165375 A1* | 7/2007 | Nicolai | .......... | H05K 7/2059 361/688 |
| 2017/0325358 A1* | 11/2017 | Franz | .......... | H05K 7/20236 |

(Continued)

*Primary Examiner* — Robert J Hoffberg
(74) *Attorney, Agent, or Firm* — Van Pelt, Yi & James LLP

(57) ABSTRACT

A system includes a coolant reservoir, a coolant pump, and a heat exchanger. The coolant reservoir is at least in part included in a data center rack and configured to hold a coolant. The coolant pump is configured to pump the coolant to a manifold configured to distribute the coolant to a plurality of different rack mounted devices. The heat exchanger is configured to cool the coolant via an ambient air of a data center.

20 Claims, 12 Drawing Sheets

(56) References Cited

U.S. PATENT DOCUMENTS

| | | | |
|---|---|---|---|
| 2017/0374761 A1* | 12/2017 | Zimmerman, Sr. | ................... H05K 7/20272 |
| 2018/0017538 A1* | 1/2018 | Rogacs | .............. H05K 7/20672 |
| 2018/0027698 A1* | 1/2018 | Cader | ................ H05K 7/20272 165/80.4 |
| 2018/0317347 A1* | 11/2018 | Cader | .................. H05K 7/2079 |
| 2019/0320548 A1* | 10/2019 | Gao | ........................ H05K 7/18 |
| 2019/0373776 A1* | 12/2019 | Gao | .................. H05K 7/20727 |

* cited by examiner

US 10,905,030 B1

LIQUID-COOLING WITHIN AN AIR-COOLED FACILITY

BACKGROUND OF THE INVENTION

The performance of an electronic component such as a computer chip is affected by its operating temperature. If components are not being cooled sufficiently, they often do not perform as well. As electronic components become more powerful, they also tend to generate more heat. Data centers include racks that each contain electronic components that generate heat. The heat can significantly degrade the performance of the data center, e.g., causing request handling to be slow, consuming large amounts of energy, and causing components to malfunction prematurely. Existing air cooling methods are becoming inadequate for maintaining an optimal temperature of electronic components.

BRIEF DESCRIPTION OF THE DRAWINGS

Various embodiments of the invention are disclosed in the following detailed description and the accompanying drawings.

DETAILED DESCRIPTION

Figure 1:
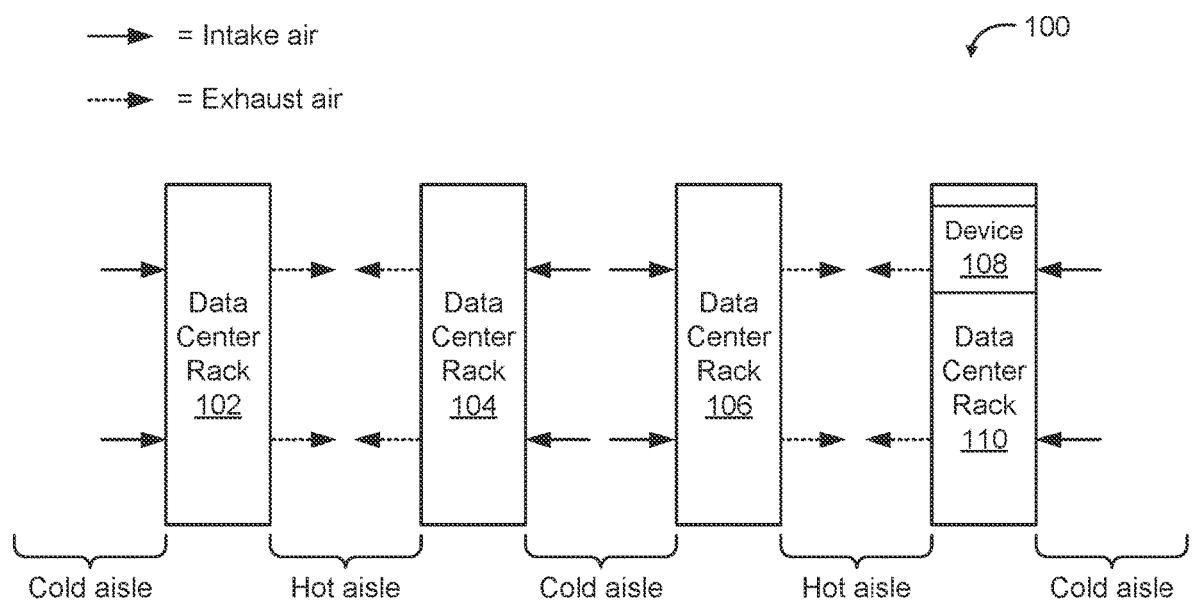
FIG. 1 is a diagram illustrating an example of data center racks in aisles of a data center.

The invention can be implemented in numerous ways, including as a process; an apparatus; a system; a composition of matter; a computer program product embodied on a computer readable storage medium; and/or a processor, such as a processor configured to execute instructions stored on and/or provided by a memory coupled to the processor. In this specification, these implementations, or any other form that the invention may take, may be referred to as techniques. In general, the order of the steps of disclosed processes may be altered within the scope of the invention. Unless stated otherwise, a component such as a processor or a memory described as being configured to perform a task may be implemented as a general component that is temporarily configured to perform the task at a given time or a specific component that is manufactured to perform the task. As used herein, the term 'processor' refers to one or more devices, circuits, and/or processing cores configured to process data, such as computer program instructions.

A detailed description of one or more embodiments of the invention is provided below along with accompanying figures that illustrate the principles of the invention. The invention is described in connection with such embodiments, but the invention is not limited to any embodiment. The scope of the invention is limited only by the claims and the invention encompasses numerous alternatives, modifications and equivalents. Numerous specific details are set forth in the following description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured.

Increased power consumption of microelectronic components in devices of data centers are pushing the limits of traditional air cooled data centers. Improved cooling through adoption of liquid cooling can help alleviate concerns with future power trends. However, this often requires a centralized liquid source to be readily available within the data center facility. Adding a centralized liquid source and an associated distribution network is costly and disruptive to operation of existing data centers. To minimize disruptions and costs, an intermediate solution leverages the existing air cooling infrastructure to enable a more feasible liquid cooling solution. For example, a closed loop liquid coolant circuit and related components are all self-contained within one or more data center rack mounted chassis, while the liquid coolant temperature is maintained using liquid-to-air heat exchangers that utilize ambient cool air of the data center to dissipate heat from the liquid coolant.

In some embodiments, a liquid cooling system includes a coolant reservoir at least in part included in a data center rack (e.g., server rack, network rack, IT rack, etc.) and configured to hold a coolant. The system also includes a coolant pump configured to pump the coolant, a manifold configured to distribute the coolant to a plurality of different data center equipment chassis (e.g., network switch, server, graphical processor device, etc.), and a heat exchanger. The heat exchanger is configured to cool the coolant via ambient air of a data center.

FIG. 1 is a diagram illustrating an example of data center racks in aisles of a data center. A data center houses network infrastructure devices such as servers, network switches, computing devices, storage devices, and other network and processing devices housed and organized within data center racks. For example, each data center rack houses a plurality of device chassis or trays mounted on the data center rack (e.g., device 108). There have been efforts to standardize data center racks. For example, the Open Compute Project's Open Rack V2 sets specifications and design guidelines for rack dimensions, rack mounted components, and the like.

The shown data center 100 includes four data center racks 102, 104, 106, and 110. The aisles between the data center racks are designated cold aisles or hot aisles because the air in the aisle is relatively cooler in the cold aisles and relatively hotter in the hot aisles. Air is taken into devices of a data center rack from the cold aisle and exhaust air is expelled into the hot aisles. This helps to cool or at least prevent overheating of electronic components of the devices inside the data center racks. Cold air within the data center can be supplied by output of an air conditioning system of the data center.

Figure 2:
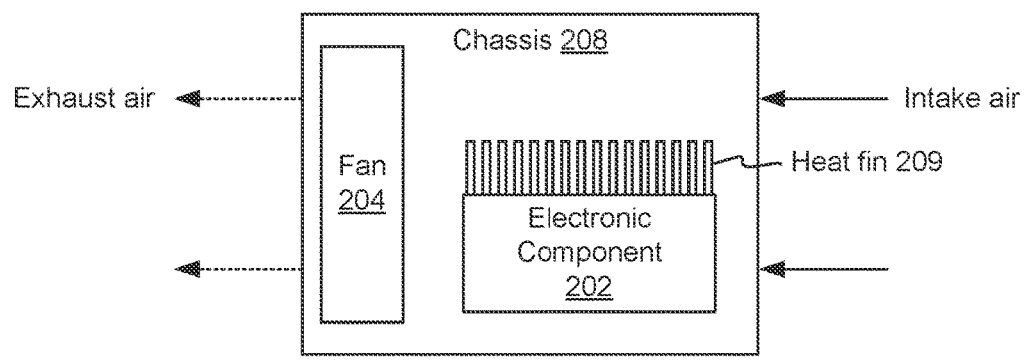
FIG. 2 is a block diagram of an embodiment of a device chassis utilizing convection cooling.

FIG. 2 is a block diagram of an embodiment of a device chassis utilizing convection cooling. Chassis 208 can be installed inside server rack 110. Electronic components in the chassis generate heat, which can degrade performance. Components in the chassis can be cooled using air. Chassis 208 includes one or more electronic components 202 (here, for simplicity, only a single electronic component is shown) and a fan 204. The operation of the fan causes air to be taken in as shown by the arrows (for example cool air from a cold aisle is drawn into the tray), which cools the component 202 as it passes through the interior of the chassis. The cool air, which has been heated by the electronic component 202, is then expelled as exhaust air (for example to a hot aisle). Heat fin 209 can be on or near the electronic component to help with increasing the effective cooling surface area of component 202 to cool the component faster.

For some electronic components, this type of convection cooling using ambient air is sufficient. However, as electronic components (such as processor chips) become more computationally powerful, they also tend to generate more heat and simple convection cooling does not maintain the ideal operating temperature range for the electronic component. In addition, fans can block air, generate their own heat, and add extra weight and complexity (e.g., moving parts) to the server assembly, which can increase operating costs. In some embodiments, rather than using heat fin 209, a liquid cooling block/plate can be used in its place. A liquid coolant circulates over the liquid cooling block/plate to continually cool the liquid cooling block/plate absorbing heat from the electronic component. In some embodiments, some components within the chassis utilize liquid cooling while other components in the chassis still utilize air convection cooling via cool air drawn in by a fan.

Figure 3:
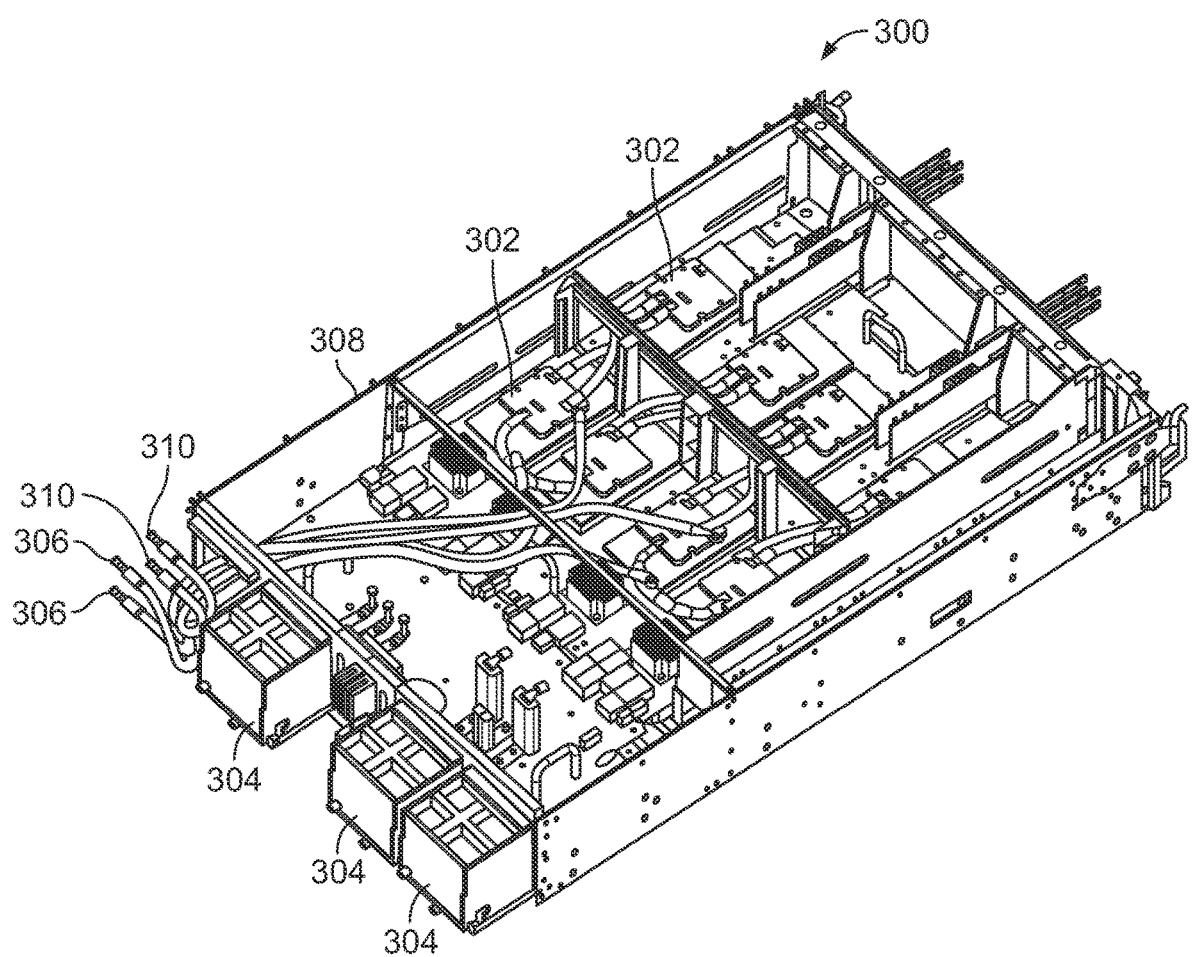
FIG. 3 is a diagram of an embodiment of a device chassis that utilizes liquid cooling.

FIG. 3 is a diagram of an embodiment of a device chassis that utilizes liquid cooling. Device 300 can be installed/mounted inside server rack 110. Device 300 is an example of device 108. Chassis 308 includes a plurality of liquid cooling blocks/plates 302 coupled to components to be temperature controlled (e.g., processor, application specific integrated circuit, graphics processing unit, or any other chip or integrated circuit, etc.). Only a portion of the liquid cooling blocks/plates have been labeled to simplify the diagram. Chassis 308 also includes fans 304 that force air to be taken in to cool other components in chassis 308 not cooled by liquid cooling.

Cooled coolant fluid is circulated over the cooling blocks/plates via tubes. Tubes 306 connect to a supply fluid channel of a cold manifold (e.g., on a data center rack) that supplies cooled coolant fluid to the cooling blocks/plates 302. The warmed coolant fluid is then returned back via tubes 310 that connect to the return fluid channel of a hot manifold to be carried out for cooling before being returned via tubes 306.

Figure 4:
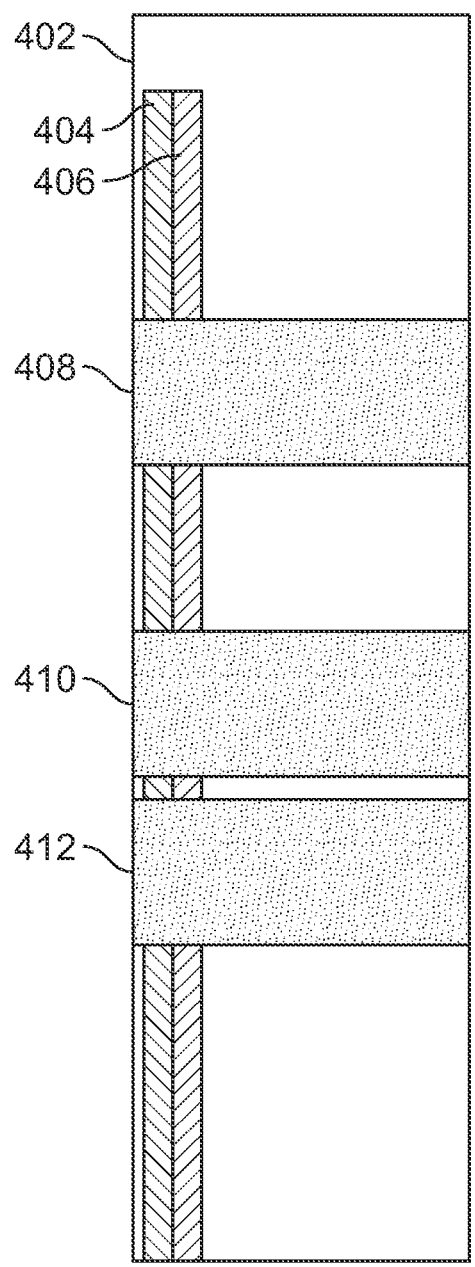
FIG. 4 is a simplified diagram of an example data center rack with manifolds.

FIG. 4 is a simplified diagram of an example data center rack with manifolds. In some embodiments, data center rack 402 is an example of rack 102, 104, 106, or 110 of FIG. 1. Rack 402 includes devices 408, 410, and 412 (e.g., network switches, servers, graphical processor devices, etc.). For example, respective chassis of devices 408, 410, and 412 are mounted in the rack. Device 300 with chassis 308 is an example of devices 408, 410, and 412. Not all of the rack mounted devices have to be liquid cooled. For example, at least one of devices 408, 410, and 412 is the device of chassis 208 of FIG. 2.

Cold manifold 404 and hot manifold 406 run along the length of rack 402. Devices mounted in rack 402 are able to connect to these manifolds to allow liquid cooling of components within the devices. For example, blind-mate or manual quick disconnect connectors connect coolant tubes of the devices to the manifolds. Cold manifold 404 distributes cooled liquid coolant to the connected devices of rack 402. For example, tubes 306 of device 300 of FIG. 3 are connected to cold manifold 404 and the coolant in cold manifold 404 flows into device 300 via tubes 306. Hot manifold 406 receives warmed liquid coolant from the connected devices of rack 402. For example, tubes 310 of device 300 of FIG. 3 are connected to hot manifold 406 and the warmed coolant from device 300 flows into hot manifold 406. The warmed coolant in hot manifold 406 can be cooled and circulated back to cold manifold 404 for distribution to connected devices. In other words, cold manifold 404 distributes the cooled coolant to the plurality of device chassis connected to it, and hot manifold 406 receives the warmed coolant from the plurality of devices connected to it.

Figure 5A:
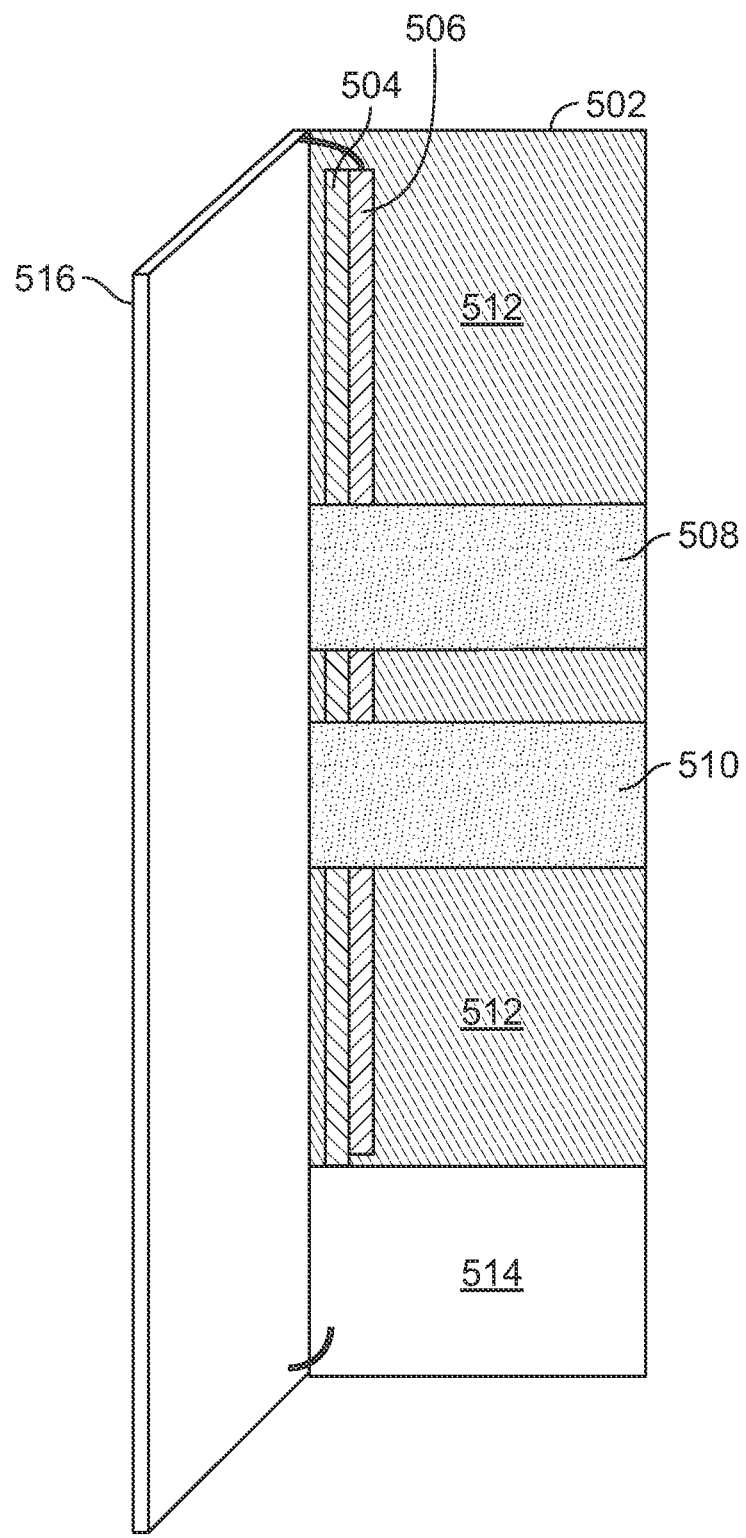
FIGS. 5A and 5B are simplified block diagrams of an embodiment of a data center rack with a door heat exchanger.
Figure 5B:
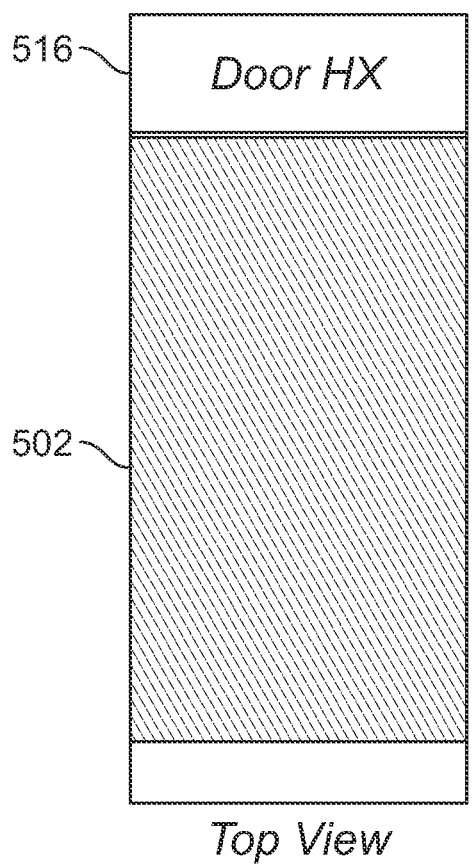

FIGS. 5A and 5B are simplified block diagrams of an embodiment of a data center rack with a door heat exchanger. FIG. 5A shows a front view of data center rack 502 with the door heat exchanger open and FIG. 5B shows a top view of data center rack 502 with the door heat exchanger closed. In various embodiments, data center rack 502 is an example of rack 102, 104, 106, or 110 of FIG. 1.

Rack 502 includes devices 508 and 510 (e.g., network switches, servers, graphical processor devices, etc.). For example, respective chassis of devices 508 and 510 are mounted in the rack. Device 300 with chassis 308 is an example of devices 508 and 510. Although two devices are shown, any number of devices may be mounted in rack 502 in internal device region 512. Not all of the rack mounted devices have to be liquid cooled. For example, at least one of devices 508 and 510 is the device of chassis 208 of FIG. 2. Rack 502 also includes coolant distribution unit 514.

Much like the example shown in FIG. 4, cold manifold 504 and hot manifold 506 run vertically in rack 502. Devices mounted in rack 502 are able to connect to these manifolds to allow liquid cooling of components within the devices. For example, blind-mate or manual quick disconnect connectors connect coolant tubes of the devices to the manifolds. Cold manifold 504 distributes cooled liquid coolant to the connected devices (e.g., devices 508 and 510) of rack 502. For example, tubes 306 of device 300 of FIG. 3 are connected to cold manifold 504 and the coolant in cold manifold 504 flows into device 300 via tubes 306. Hot manifold 506 receives warmed liquid coolant from the connected devices of rack 502. For example, tubes 310 of device 300 of FIG. 3 are connected to hot manifold 506 and the warmed coolant from device 300 flows into hot manifold 506. The warmed coolant in hot manifold 506 from devices is fed into door heat exchanger 516 via a connection (e.g., flexible tubing) from hot manifold 506 to door heat exchanger 516.

Door heat exchanger 516 provides liquid-to-air cooling. The coolant passes through heat exchanging elements (e.g., fin coil or any other type of heat exchanger) of door heat exchanger 516 and the ambient air cools the heat exchanging elements that in turn cool the coolant passing through the heat exchanging elements. Thus, rather than using door heat exchanger 516 to cool the air passing through the door heat exchanger, the air passing through door heat exchanger 516 cools the liquid coolant. Door heat exchanger 516 is coupled to rack 502 via one or more hinges and allows door heat exchanger 516 to swing open and close. FIG. 5A shows it in the open position and FIG. 5B shows it in the closed position. Door heat exchanger 516 may be coupled to a front of rack 502 (e.g., front door heat exchanger as air flow enters rack 502 through door heat exchanger 516) or a back of rack 502 (e.g., back door heat exchanger as air flow exits rack 502 through door heat exchanger 516). Door heat exchanger 516 also serves as a door to rack 502 and can be opened to access the devices/equipment mounted in the rack. In some embodiments, door heat exchanger 516 is lockable to rack 502 and can only be swung open when it is unlocked (e.g., using a key). By integrating the heat exchanger in the door of rack 502, the heat exchanger is able to take advantage of the large exposed surface area form factor of the door to increase cooling efficiency of the heat exchanger without taking up valuable space inside rack 502 that can be utilized for rack mounted devices/equipment.

The ambient air passing through door heat exchanger 516 may be forced via one or more fans. In some embodiments, the fans (e.g., hot-swappable fans) are included in and/or coupled to door heat exchanger 516. In some embodiments, the fans that force air through door heat exchanger 516 are included in devices/equipment (e.g., device 508, 510, etc.) mounted in rack 502. For example, the fans already existing in the component devices/equipment to cool the components within the chassis of the devices/equipment are leveraged to also force air through the heat exchanger components of door heat exchanger 516. In an embodiment where the door heat exchanger 516 is a front door, with the air forced into the chassis of device 508, the cooled air in the data center first passes through door heat exchanger 516 before being forced into the chassis. In an embodiment where the door heat exchanger 516 is a back door, the air forced out of the chassis of device 508 passes through door heat exchanger 516 before exiting to the hot aisle of the data center. In some embodiments, the air cooling door heat exchanger 516 is not forced using a fan.

The coolant cooled by door heat exchanger 516 is able to be recirculated to cold manifold 504 for distribution to cool components within connected devices (e.g., to devices 508 and 510). Coolant distribution unit 514 is a rack mounted device/equipment and the chassis of unit 514 includes one or more pumps to provide the circulation. Coolant distribution unit 514 is connected to door heat exchanger 516 and cold manifold 504. For example, coolant distribution unit 514 receives the cooled coolant via an exit tube from door heat exchanger 516 and the received coolant is pumped via a pump that forces the cooled coolant to cold manifold 504 that distributes it to a plurality of rack mounted devices. Coolant distribution unit 514 may also include a coolant reservoir (e.g., to compensate for coolant loss over time and maintain an appropriate amount of coolant volume within the coolant circuit) and digital components to provide monitoring and management controls. Although one coolant distribution unit is shown, multiple instances of the coolant distribution unit that work together to provide liquid cooling are included in the same rack in various embodiments.

The closed circuit loop coolant circuit runs from rack mounted devices to hot manifold 506 to door heat exchanger 516 to coolant distribution unit 514 to cold manifold 504 and back to the rack mounted devices. Thus rack 502 with its coupled coolant distribution unit 514 and door heat exchanger 516 provides a self-contained solution to provide liquid cooling to rack mounted components by leveraging cooled air of a data center rather than relying on a centralized cooled liquid source.

Figure 6A:
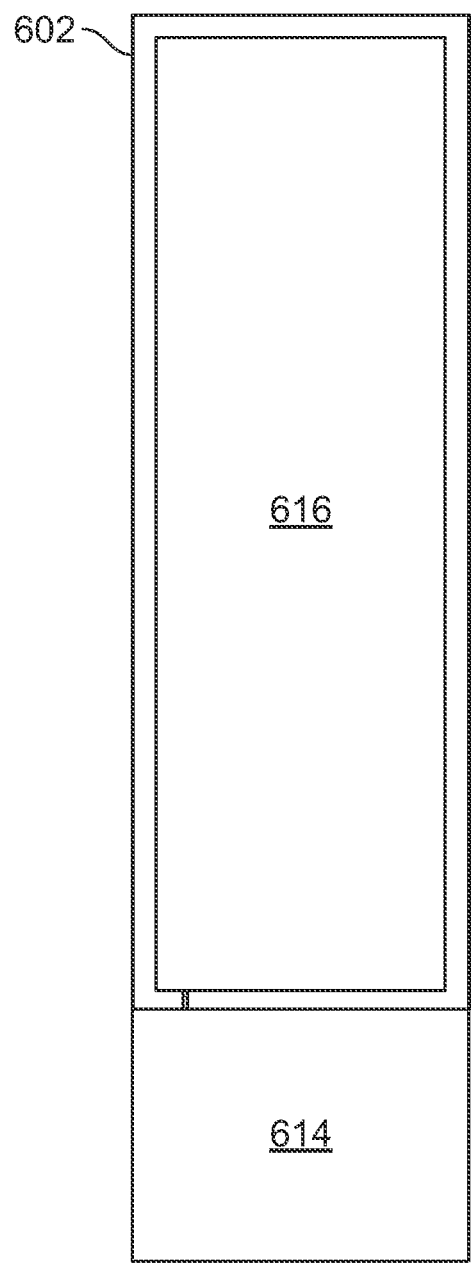
FIGS. 6A and 6B are simplified diagrams of an embodiment of a data center rack with an in-rack heat exchanger.
Figure 6B:
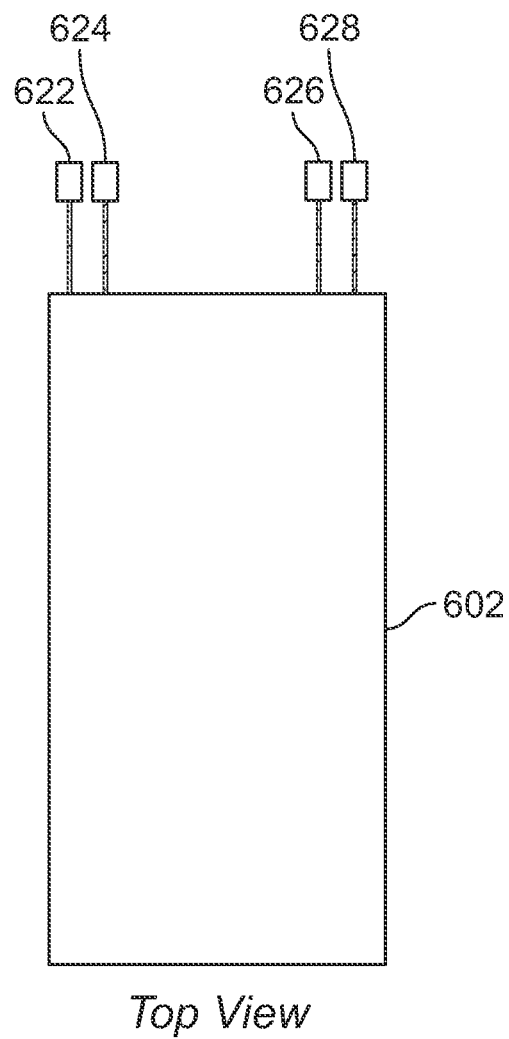

FIGS. 6A and 6B are simplified diagrams of an embodiment of a data center rack with an in-rack heat exchanger. FIG. 6A shows a front view of data center rack 602 and FIG. 6B shows a top view of data center rack 602. In various embodiments, data center rack 602 is an example of rack 102, 104, 106, or 110 of FIG. 1.

Rather than using a door heat exchanger as shown in the embodiment of FIGS. 5A and 5B, data center rack 602 utilizes in-rack heat exchanger 616. Thus by including the heat exchanger within rack 602, the hinged door heat exchanger is not required. Additionally, in-rack heat exchanger 616 is able to be thicker/deeper due to the larger thickness of the rack as compared to a thickness/depth of a door suitable for the rack. The increased thickness/depth of the heat exchanger allows heat exchanger elements to be larger with a larger surface area to dissipate the heat of the coolant cycling through a heat exchanging tube of the in-rack heat exchanger.

Rack 602 also includes coolant distribution unit 614. The shown rack 602 does not include rack mounted devices with liquid cooled components. Rather than cooling devices within the same rack, rack 602 cools devices in one or more other racks. For example, rack 602 cools rack mounted devices in one or more adjacent racks or another rack in a same rack row within a data center. Coolant conduits run from rack 602 to the other racks with devices being liquid cooled with rack 602. In another embodiment, a rack includes a smaller in-rack heat exchanger (e.g., as compared to in-rack heat exchanger 616) and one or more rack mounted devices that include one or more components that are liquid cooled using a coolant cooled using the smaller in-rack heat exchanger, allowing the smaller in-rack heat exchanger to cool devices within the rack and optionally other devices in other racks connected to the rack with the smaller in-rack heat exchanger. In some embodiments, rack 602 includes an air-cooled rack mounted device (e.g., device of chassis 208 of FIG. 2) in addition to a liquid cooled device.

In-rack heat exchanger 616 is enclosed in a chassis mounted to rack 602 in some embodiments, while in other embodiments in-rack heat exchanger 616 is included in rack 602 without an enclosure chassis. In-rack heat exchanger 616 may include one or more of the following types of heat exchangers: fin coil, 3D printed heat exchanger, non-regular shaped heat exchanger (e.g., triangular shaped), metal foam, etc. In some embodiments, in-rack heat exchanger 616 represents a plurality of modular chassis that each include a heat exchanger. Individual ones of these plurality of modular chassis can be added/removed and linked together to form a desired heat exchanger size within the rack.

The warmed coolant is fed into in-rack heat exchanger 616, and in-rack heat exchanger 616 provides liquid-to-air cooling. The coolant passes through a fluid channel/conduit of heat exchanging elements and the ambient air cools the heat exchanging elements that in turn cool the coolant passing through the heat exchanging elements. The ambient air passing through in-rack heat exchanger 616 may be forced via one or more fans. In some embodiments, the fans (e.g., hot-swappable fans) are included in and/or coupled to in-rack heat exchanger 616. In some embodiments, the fans that force air through door heat exchanger 516 are included separately in rack 602. In some embodiments, ambient air passively passes through in-rack heat exchanger 616 without requiring a use of a fan within rack 602.

The coolant to be cooled is provided to rack 602 from rack mounted devices in one or more other racks. For example, liquid cooling components of rack 602 are connected to hot and cold manifolds of another rack via coolant conduit/tubing. In the example shown in FIG. 6B, the sets of coolant conduits with connectors to be connected to conduits leading to other racks are shown. Connector 622 is to be connected to a coolant conduit leading to a cold manifold of a neighboring rack, and connector 624 is to be connected to a coolant conduit coming from a hot manifold of the neighboring rack. Connector 626 is to be connected to a coolant conduit leading to a cold manifold and connector 628 is to be connected to a coolant conduit coming from a hot manifold of another neighboring rack. For example, connector 622 is to be connected to a coolant conduit connected to cold manifold 404 and connector 624 is to be connected to a coolant conduit connected to hot manifold 406 of rack 402 of FIG. 4. This allows rack 602 to house the major liquid cooling components without requiring rack 402 to include them. The connectors may include a blind-mate connector, a quick disconnect connector, or any other type of fluid conduit connector.

In some embodiments, the warmed coolant from a rack mounted device of a neighboring rack flows into its hot manifold and travels out of the neighboring rack and into rack 602 (e.g., via connector 624). Then the warmed coolant travels through in-rack heat exchanger 616 and becomes cooled. The coolant cooled by in-rack heat exchanger 616 is able to be then recirculated back to the neighboring rack (e.g., via connector 622) where it flows into its cold manifold for distribution back to the liquid cooled rack mounted device of the neighboring rack.

Coolant distribution unit 614 is a rack mounted device/equipment and the chassis of unit 614 includes one or more pumps to provide the circulation. Coolant distribution unit 614 is connected to in-rack heat exchanger 616 and an output coolant port providing cooled coolant to one or more other racks. For example, coolant distribution unit 614 receives the cooled coolant via an exit tube from in-rack heat exchanger 616 and the received coolant is pumped via a pump that forces the cooled coolant to the output port that distributes it to one or more other racks. Coolant distribution unit 614 may also include a coolant reservoir (e.g., to compensate for coolant loss over time and maintain an appropriate amount of coolant volume within the coolant circuit) and digital logic components to provide monitoring and management controls. Although one coolant distribution unit is shown, multiple instances of the coolant distribution unit that work together to provide liquid cooling are included in the same rack in various embodiments.

Thus rack 602, with its coolant distribution unit 614 and heat exchanger 616 that utilizes the cooled air of a data center, provides a modular rack contained solution to provide liquid cooling to neighboring racks without requiring the facilities of the data center to be modified to provide a centralized cooled liquid source.

Figure 7A:
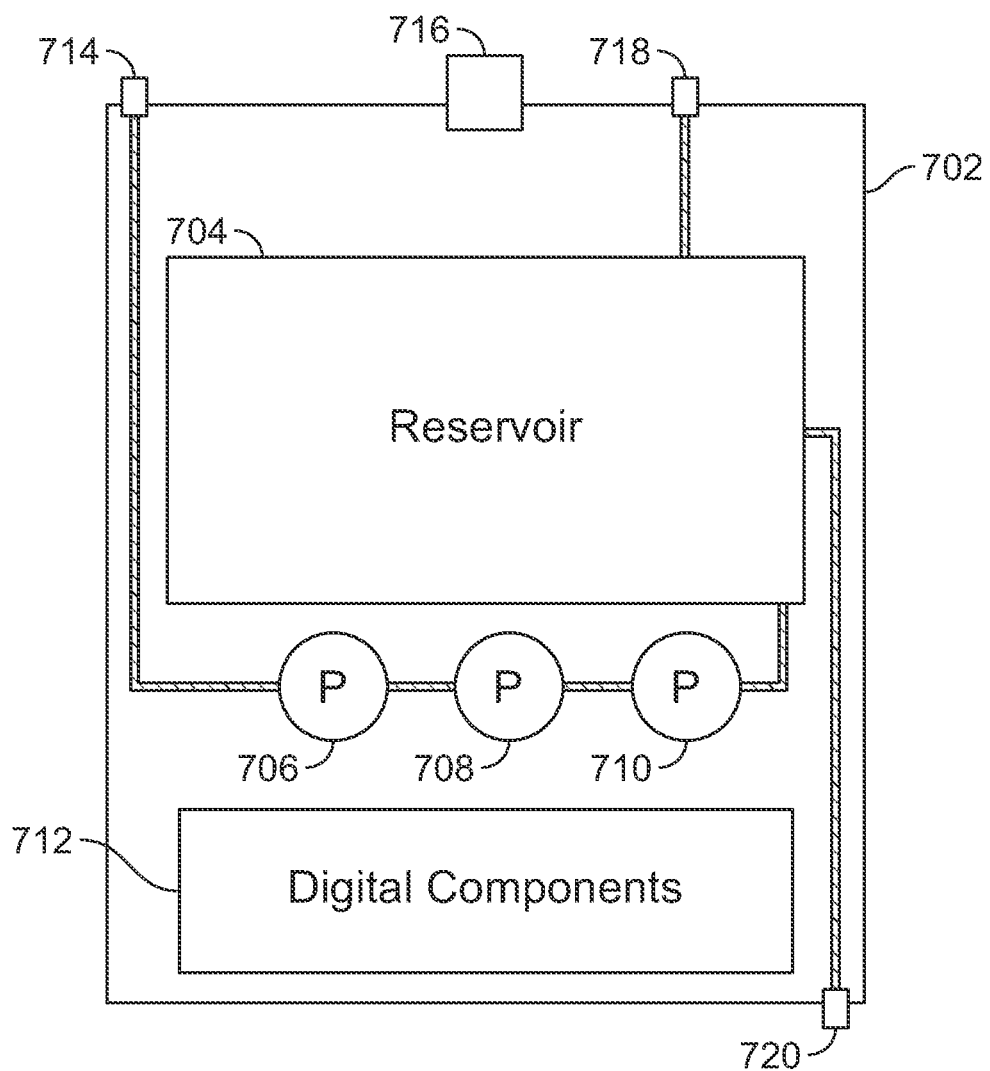
FIGS. 7A and 7B are block diagrams of an embodiment of a coolant distribution unit.
Figure 7B:
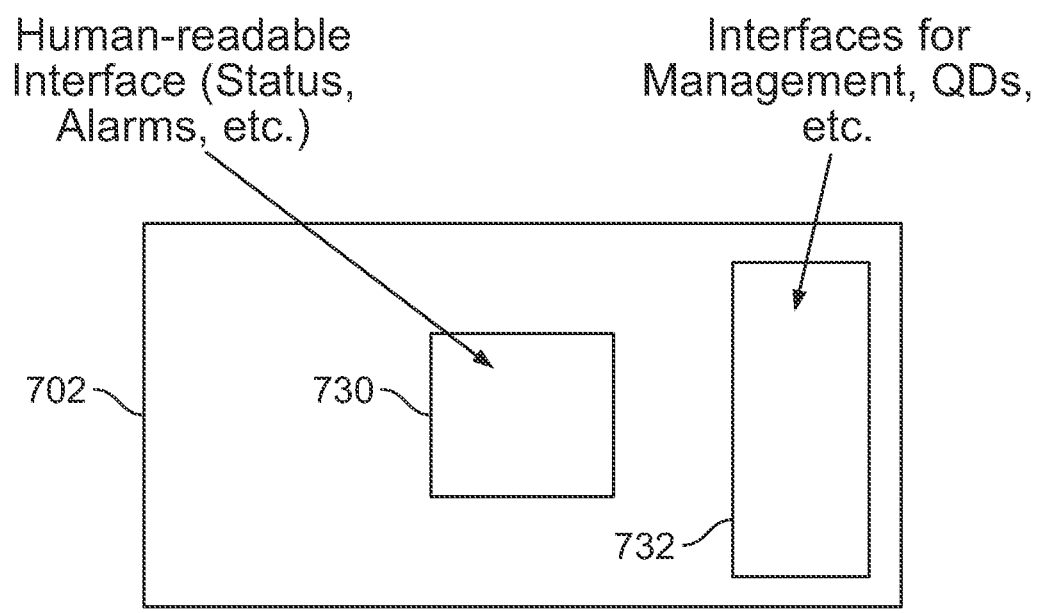

FIGS. 7A and 7B are block diagrams of an embodiment of a coolant distribution unit. FIG. 7A shows a top view of coolant distribution unit 702, and FIG. 7B shows a front view of coolant distribution unit 702. In various embodiments, coolant distribution unit 702 is an example of coolant distribution unit 514 and/or 614 shown in FIGS. 5A and 6A.

Coolant distribution unit 702 includes a chassis that mounts/couples to a data center rack (e.g., rack 502, rack 602, etc.). The chassis includes reservoir 704, pumps 706, 708, 710, and digital components 712. Connector 718 connects to a pipe leading to reservoir 704 and is configured to connect to an output of a heat exchanger. For example coolant cooled by door heat exchanger 516 in an embodiment or in-rack heat exchanger 616 in another embodiment is provided to unit 702 via a coolant conduit connected to connector 718. Reservoir 704 stores the cooled coolant and reserved coolant in the reservoir allows for compensation of coolant loss over time and ensures that an appropriate amount of coolant volume is maintained within the coolant circuit. Connector 720 connects to a pipe leading to reservoir 704 and is configured to allow coolant in reservoir 704 to be serviced. For example, connector 720 is on a front panel of unit 702 and allows a technician to service the coolant by refilling reservoir 704 via connector 720 or drawing coolant from reservoir 704 via connector 720 to test and/or replace the coolant.

Pumps 706, 708, and 710 pump the coolant in reservoir 704 to circulate the coolant in the coolant circuit. The coolant pumped by pumps 706, 708, and/or 710 travels in a tube leading to connector 714. Connector 714 is configured to be connected to a coolant conduit that leads to a cold manifold for distribution to one or more rack mounted devices being liquid cooled. For example, connector 714 connects to cold manifold 504. In another example, connector 714 connects to a coolant conduit that leads to a cold manifold (e.g., cold manifold 404) of a rack neighboring rack 602 that includes coolant distribution unit 702. The shown connectors may include a blind-mate connector, a quick disconnect connector, or any other type of fluid conduit connector. The plurality of pumps not only provides fault redundancy in case of failure but also increases the service life of the pumps. For example, not all of the pumps are operated at the same time and when one of the pumps fails, another one of the pumps in a standby state is able to be dynamically turned on to make up for the failed pump. Additionally, in order to increase the service life of the pumps, each of the pumps are turned off at different periods on a cycle to prevent any one of them from constantly running and overheating.

Coolant distribution unit 702 obtains power from a power distribution of a data center rack it is mounted to. Power bar 716 that runs along the rack provides power to the components of unit 702. Digital components 712 include components that handle/manage power delivery, control, monitoring, and other functions for unit 702. For example, digital components 712 include one or more processors, application-specific integrated circuits (ASICs), sensors, communication components, and other unit management components. Digital components 712 can be used to monitor a status of liquid cooling, manage its operation, and/or report its status. For example, coolant temperature, reservoir level, pump speed, pump status, coolant flow speed, power consumption, fan speed (e.g., fan used to force air through a heat exchanger such as fan(s) of door heat exchanger 516 or in-rack heat exchanger 616) or other parameters can be monitored to ensure they are within a desired specification. If it is detected that the parameters are not within the desired specification, corrective action can be automatically determined and implemented (e.g., increase/decrease pump speed, failover to a standby pump, increase/decrease fan speed, etc.). Alerts and/or monitored parameters can be reported. For example, digital components 712 include wired (e.g., unit 702 is connected to a network switch of a rack via an Ethernet adapter included in digital components 712) and/or wireless communication components (e.g., wireless communication radio) that report alerts and/or parameters to a user via a network connection. Additionally, a user is able to remotely control unit 702 (e.g., adjust coolant temperature, flow rate, etc.) via the network connection.

Front of unit 702 shown in FIG. 7B includes human-readable interface 730 and management interface 732. Human-readable interface 730 may include one or more of the following: a digital screen, a status light, a display, or any other indicator. A technician is able to physically view any alerts or status of unit 702 via human-readable interface 730 on the front panel of unit 702. Management interface 732 may include one or more of the following: a touch screen, a button, a switch, and/or a coolant access port (e.g., connector 720) that can be used to configure (e.g., change settings) and manage unit 702. An example of the coolant access port is a quick disconnect (QD) connector port that allows a technician to service the coolant by refilling reservoir 704 via connector 720 or drawing coolant from reservoir 704 via connector 720 to test and/or replace the coolant.

The components of coolant distribution unit 702 shown in FIGS. 7A-7B are merely an example and have been simplified to illustrate the embodiment clearly. Other components not shown in these figures do exist in various embodiments.

Figure 8A:
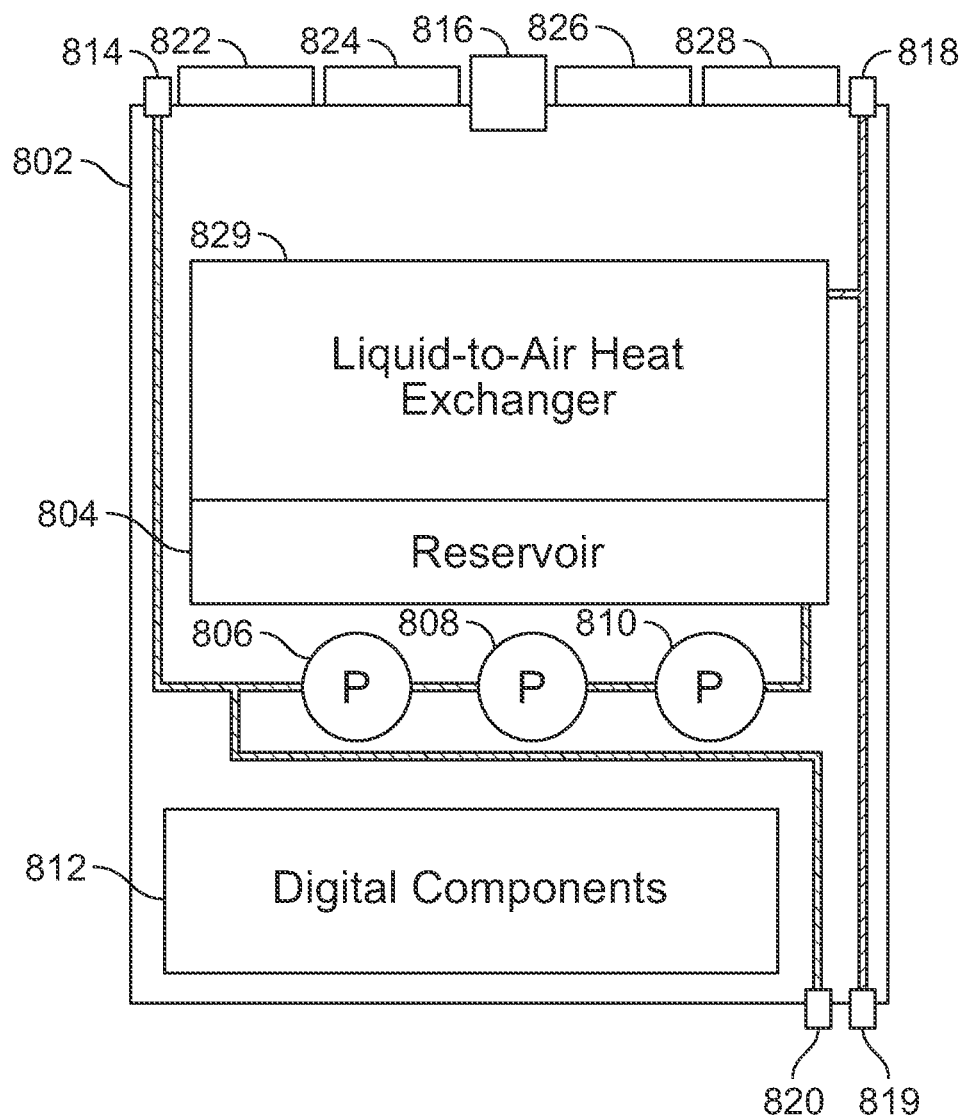
FIGS. 8A and 8B are block diagrams of an embodiment of a coolant distribution unit with an internal heat exchanger.
Figure 8B:
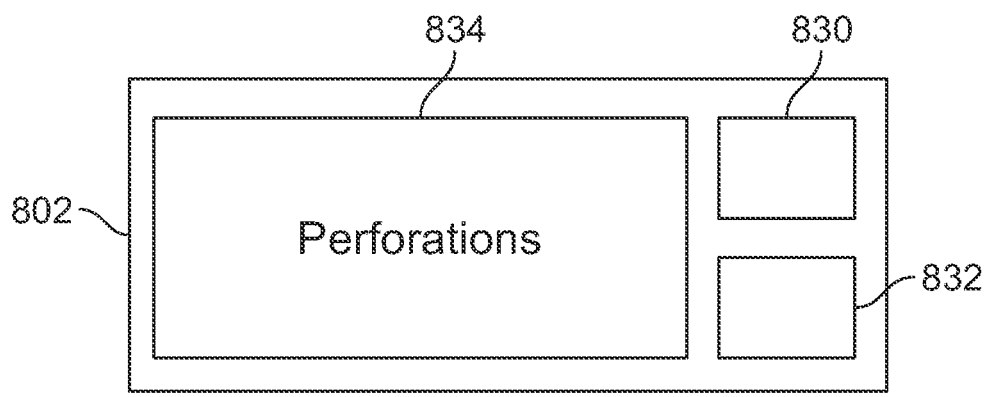

FIGS. 8A and 8B are block diagrams of an embodiment of a coolant distribution unit with an internal heat exchanger. FIG. 8A shows a top view of coolant distribution unit 802, and FIG. 8B shows a front view of coolant distribution unit 802. In some embodiments, coolant distribution unit 802 is an example of a coolant distribution unit that can be mounted in rack 402 of FIG. 4 to circulate and maintain the temperature of the coolant circulated to/from devices 408, 410, 412 via manifolds 404 and 406.

Coolant distribution unit 802 includes internal heat exchanger 829. By including the heat exchanger within the chassis of coolant distribution unit 802, an additional separate external heat exchanger component is not required. This may simplify installation and maintenance by having the major liquid cooling components enclosed within the same chassis. If one internal unit heat exchanger is not sufficient to cool devices of a rack, additional coolant distribution units with respective internal heat exchangers can be modularly added to the rack to increase cooling. These multiple coolant distribution units are connected to the same hot and cold manifolds to allow them to cohesively work together to cool the same set of liquid cooled rack mounted devices. Additionally, network communication between the multiple coolant distribution units can also allow the units to coordinate with one another to provide power efficient and effective liquid cooling. Internal heat exchanger 829 may include one or more of the following types of heat exchangers: fin coil, 3D printed heat exchanger, non-regular shaped heat exchanger (e.g., triangular shaped), metal foam, etc.

Connectors 818 and 819 connect to a pipe leading to heat exchanger 829. In an example, coolant that is warmed by one or more liquid cooled devices is provided to a hot manifold (e.g., hot manifold 406) and the hot manifold is connected to a coolant conduit that connects to either connector 818 or 819. The warmed coolant from the hot manifold enters unit 802 and is fed into heat exchanger 829. Heat exchanger 829 provides liquid-to-air cooling. The coolant passes through a fluid channel/conduit of heat exchanging elements and the ambient air passing through the heat exchanger cools the heat exchanging elements that in turn cool the coolant passing through the heat exchanging elements. The ambient air passing through in-rack heat exchanger 829 is forced via fans 822, 824, 826 and 828. These fans draw air into unit 802 via perforations 834 (e.g., facing cold aisle of a data center) in a front panel of unit 802. The air passes through components of unit 802 and exits out a back of unit 802 (e.g., into data center hot aisle). These fans are hot-swappable, allowing any failed fans to be removed and replaced without shutting down the entire unit 802. If it is detected that any of the fans have failed, speed of other fans can be increased as a fail-safe measure to compensate for the failed fan while the failed fan is waiting to be replaced. The coolant cooled by heat exchanger 829 flows into liquid coolant reservoir 804. Reservoir 804 stores the cooled coolant and the stored coolant in the reservoir allows for compensation of coolant loss over time and ensures that an appropriate amount of coolant volume is maintained within the coolant circuit.

Pumps 806, 808, and 810 pump the coolant in reservoir 804 to circulate the coolant in the coolant circuit. The coolant pumped by pumps 806, 808, and/or 810 travels in a tube leading to connector 814. Connector 814 is configured to be connected to a coolant conduit that leads to a cold manifold for distribution to one or more rack mounted devices being liquid cooled. For example, connector 814 connects to cold manifold 504. The plurality of pumps not only provides fault redundancy in case of failure but also increases the service life of the pumps. For example, not all of the pumps are operated at the same time and when one of the pumps fails, another one of the pumps in a standby state is able to be dynamically turned on to make up for the failed pump. Additionally, in order to increase the service life of the pumps, each of the pumps are turned off at different periods on a cycle to prevent any one of them from constantly running and overheating. Connector 820 connects to a pipe outputting coolant fluid pumped from reservoir 804 and is configured to allow coolant in unit 802 to be serviced. For example, connector 820 is on a front panel of unit 802 and allows a technician to service the coolant by refilling reservoir 804 via connector 820 or draw coolant via connector 820 to test and/or replace the coolant. The connectors of unit 802 may include a blind-mate connector, a quick disconnect connector, or any other type of fluid conduit connector.

Coolant distribution unit 802 obtains power from a power distribution of a data center rack it is mounted to. Power bar 816 that runs along the rack provides power to the components of unit 802. Digital components 812 include components that handle/manage power delivery, control, monitoring, and other functions for unit 802. For example, digital components 812 include one or more processors, application-specific integrated circuits (ASICs), sensors, communication components, and other unit management components. Digital components 812 can be used to monitor a status of liquid cooling, manage its operation, and/or report its status. For example, coolant temperature, reservoir level, pump speed, pump status, coolant flow speed, power consumption, fan speed (e.g., fan used to force air through a heat exchanger such as fan(s) of door heat exchanger 516 or in-rack heat exchanger 616) or other parameters can be monitored to ensure they are within a desired specification. If it is detected that the parameters are not within the desired specification, corrective action can be automatically determined and implemented (e.g., increase/decrease pump speed, failover to a standby pump, increase/decrease fan speed, etc.). Alerts and/or monitored parameters can be reported. For example, digital components 812 include wired (e.g., unit 802 is connected to a network switch of a rack via an Ethernet adapter included in digital components 812) and/or wireless communication components (e.g., wireless communication radio) that report alerts and/or parameters to a user via a network connection. Additionally, a user is able to remotely control unit 802 (e.g., adjust coolant temperature, flow rate, etc.) via the network connection.

Front of unit 802 shown in FIG. 8B includes perforations 834, human-readable interface 830, and management interface 832. Human-readable interface 830 may include one or more of the following: a digital screen, a status light, a display, or any other indicator. A technician is able to physically view any alerts or status of unit 802 via human-readable interface 830 on the front panel of unit 802. Management interface 832 may include one or more of the following: a touch screen, a button, a switch, and/or a coolant access port (e.g., connector 820) that can be used to configure (e.g., change settings) and manage unit 802. An example of the coolant access port is a quick disconnect (QD) connector port that allows a technician to service the coolant by refilling reservoir 804 via connector 820 or drawing coolant from reservoir 804 via connector 820 to test and/or replace the coolant.

The components of coolant distribution unit 802 shown in FIGS. 8A-8B are merely an example and have been simplified to illustrate the embodiment clearly. Other components not shown in these figures do exist in various embodiments.

Figure 9:
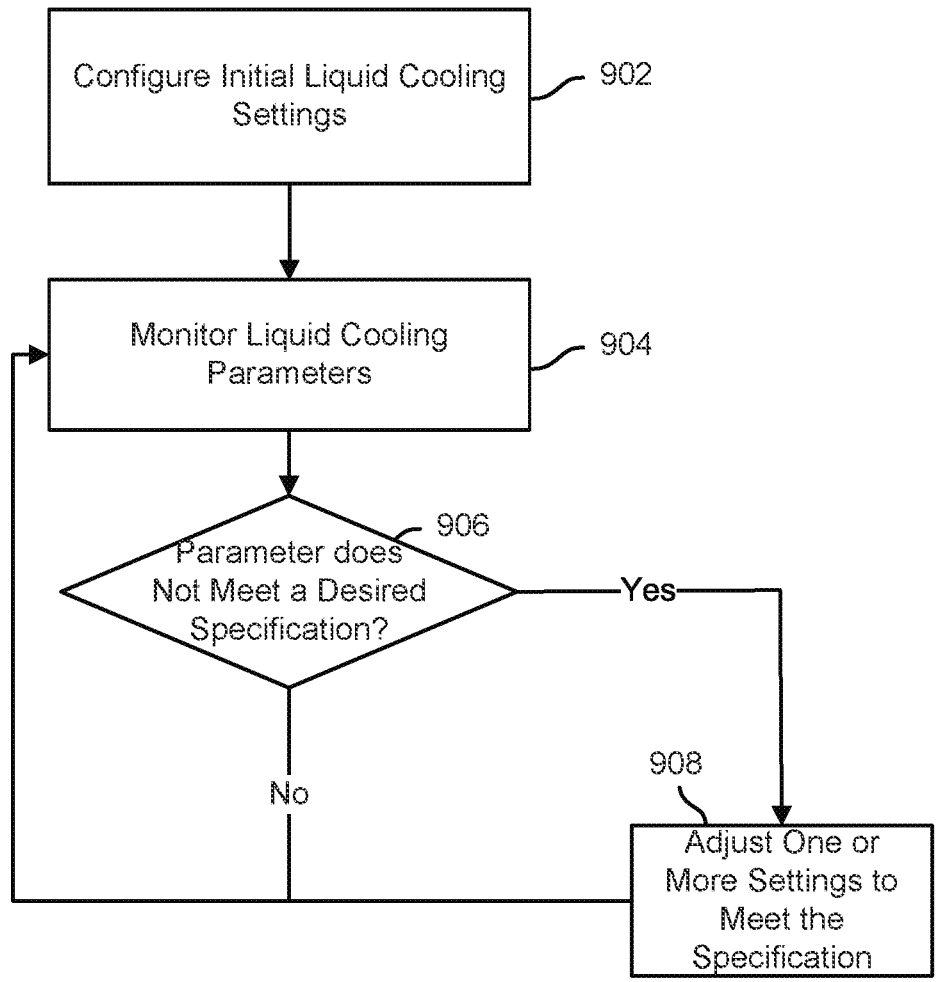
FIG. 9 is a flowchart illustrating an embodiment of a process for automatically managing a coolant distribution unit.

FIG. 9 is a flowchart illustrating an embodiment of a process for automatically managing a coolant distribution unit. The process of FIG. 9 may be at least in part implemented by coolant distribution unit 514, 614, 702 and/or 802 of FIGS. 5A-8B.

At 902, initial liquid cooling settings are configured. The liquid cooling settings include one or more of the following: a pump speed, selection of pumps to be active, pump operation schedule (e.g., operation mode/cycle schedule, inactive period, operation times, etc.), a fan speed, a selection of fans to be active, fan operation schedule (e.g., operation mode/cycle schedule, inactive period, operation times, etc.), desired coolant temperature, desired coolant temperature range, coolant temperature schedule, desired power consumption, desired power consumption range, power consumption schedule, etc. In some embodiments, the initial liquid cooling settings include a preconfigured default setting. For example, one or more stored predetermined default settings are utilized as an initial setting.

In some embodiments, at least a portion of the initial liquid cooling settings is dynamically determined based on a determination of devices to be liquid cooled. For example, a liquid cooling demand is determined/calculated based on an expected total heat load of the determined devices to be liquid cooled, and the initial liquid cooling settings are set based on the determined/calculated liquid cooling demand. The devices to be liquid cooled may be identified based at least in part on a received specification and/or an automatic determination. For example, a user specified specification may be received and/or the devices may be automatically discovered based on a network communication with a server storing a record of the devices (e.g., record of devices installed on a rack) and/or communication with a network switch of the rack or the devices via the network switch of the rack including the coolant distribution unit being configured.

In some embodiments, the initial liquid cooling settings are also based on available liquid cooling resources. For example, the number and types of coolant distribution unit(s), pump(s), heat exchanger(s), and/or fan(s) available for utilization are used in determining the initial liquid cooling settings. The resources to be configured can be selected among the available liquid cooling resources. Additionally, a specific setting can be tailored for a specific manufacturer, capability, feature, and/or performance of a specific resource component as well as an aggregate of the available capabilities/performances of the resources. For example, the total desired amount of pump or fan work is divided among multiple pump/fan resources by dividing the total desired work by the determined total number of available pump/fan resources. The available liquid cooling resources may be identified based at least in part on a received specification and/or an automatic determination. For example, a user specified specification may be received, stored, and/or the resources may be automatically discovered.

At 904, liquid cooling parameters are monitored. Monitoring the parameters may include receiving/obtaining the parameters from one or more sensors and/or components within or external to a coolant distribution unit. Examples of the liquid cooling parameters being monitored include one or more of the following: a coolant temperature entering coolant distribution unit, a coolant temperature exiting coolant distribution unit, a coolant temperature within a coolant reservoir, a coolant temperature entering a heat exchanger, a coolant temperature exiting a heat exchanger, a component temperature, a pump temperature, a processor temperature, a temperature of air coming into a coolant distribution unit, a temperature of air exiting a coolant distribution unit, a temperature of air coming into a heat exchanger, a temperature of air exiting a heat exchanger, a power consumption of a component, a power consumption of a pump, a power consumption of a fan, a fan speed, air speed, a coolant flow rate/speed, pump speed/rate, a component status, a pump status (e.g., functional or failure status), a fan status (e.g., functional or failure status), etc. Monitoring the parameters may include storing the parameters, reporting the parameters (e.g., via a network connection), displaying the parameters (e.g., on a screen of a panel of a coolant distribution unit), and/or analyzing the parameters.

At 906 it is determined whether any of the monitored parameters does not meet a desired specification. For example, the monitored parameters are analyzed. Analyzing a parameter may include comparing it to a specified reference value, state, status, range, and/or threshold. One or more different parameters or a same parameter over time may be combined and/or analyzed together in performing a comparison to a specified reference value, state, status, range, and/or threshold. If a parameter does not meet the desired reference value, state, status, range, and/or threshold, it is determined that the parameter does not meet the desired specification and the process proceeds to 908. If every parameter meets the desired reference value, state, status, range, and/or threshold, it is determined that the parameter does meet the specification and the process proceeds back to 904.

At 908, one or more liquid cooling settings are automatically adjusted in an attempt to the meet the specification. For example, the one or more settings to adjust and the amount of adjustment are identified based on a type, magnitude, and/or direction (e.g., positive or negative difference) of a deviation from the desired specification. For example, if it is determined that a coolant temperature is above a threshold range, a pump speed/rate and/or a fan speed is automatically increased by a magnitude based on the amount of temperature deviation from the threshold range. Conversely, if it is determined that a coolant temperature is below a threshold range, a pump speed/rate and/or a fan speed is automatically decreased by a magnitude based on the amount of temperature deviation from the threshold range. In another example, if it is determined that a data center ambient temperature is above/below a threshold range, a pump speed/rate and/or a fan speed is automatically increased/decreased by a magnitude based on the amount of temperature deviation from the threshold range. In another example, if it is detected that a pump or a fan has failed, a standby pump/fan is placed in an active state and/or a pump speed/rate and/or a fan speed of one or more other fans/pumps are automatically increased by a determined magnitude to compensate for the failure. Additionally, a notification regarding the failure is provided (e.g., via a network communication). In another example, if it is determined that a pump has been in an active operational state beyond a threshold amount of time, the pump is placed in a rest/standby state while another pump in a rest/standby state is placed back into an active operational state to cycle through selective uses of pumps (e.g., to increase service life of pumps by allowing the pumps to cool down in a cycle). After 908, the process returns back to 904.

Although the foregoing embodiments have been described in some detail for purposes of clarity of understanding, the invention is not limited to the details provided. There are many alternative ways of implementing the invention. The disclosed embodiments are illustrative and not restrictive.

What is claimed is:

1. A system, comprising:
a first coolant reservoir at least in part included in a first data center rack and configured to hold a coolant;
a first coolant pump configured to pump the coolant to a manifold configured to distribute the coolant to a plurality of different rack mounted devices included in a second data center rack different from the first data center rack but linked to the first data center rack, wherein the first data center rack includes a first coolant distribution unit including the first coolant pump and the first coolant reservoir, and wherein a third data center rack includes a second coolant distribution unit including a second coolant reservoir and a second coolant pump that is connected to the manifold configured to distribute the coolant to the different rack mounted devices included in the second data center rack, and the first coolant distribution unit of the first data center rack is configured to communicate with the second coolant distribution unit of the third data center rack via a data network to coordinate power efficiency of cooling duty shared at least between the first coolant distribution unit of the first data center rack and the second coolant distribution unit of the third data center rack; and
a heat exchanger configured to cool the coolant via an ambient air of a data center, wherein the heat exchanger is included inside a fixed external enclosure of the first data center rack as an open component without another enclosure surrounding the heat exchanger inside the fixed external enclosure of the first data center rack.

2. The system of claim 1, wherein a second heat exchanger is included in a front hinged door of the first data center rack.

3. The system of claim 1, wherein a second heat exchanger is included in a back hinged door of the first data center rack.

4. The system of claim 1, wherein the heat exchanger includes a metal foam.

5. The system of claim 1, wherein a second heat exchanger is included within the third data center rack.

6. The system of claim 1, wherein a second heat exchanger is included inside a fixed external enclosure of the third data center rack as an open component without another enclosure surrounding the second heat exchanger inside the fixed external enclosure of the third data center rack.

7. The system of claim 1, wherein a second heat exchanger of the third data center rack is included in a coolant distribution unit chassis that includes the second coolant pump.

8. The system of claim 1, wherein the first coolant reservoir and the first coolant pump are included in a coolant distribution unit chassis mounted in the first data center rack.

9. The system of claim 8, wherein the first coolant distribution unit is a part of a plurality of different coolant distribution units included in the first data center rack.

10. The system of claim 1, wherein the first coolant pump is one of a plurality of coolant pumps included in the system.

11. The system of claim 1, wherein the ambient air of the data center is drawn from a cold aisle of the data center.

12. The system of claim 1, wherein the first coolant pump is configured to pump the coolant from the first data center rack to the second data center rack.

13. The system of claim 1, further comprising a plurality of fans.

14. The system of claim 1, further comprising a processor configured to monitor one or more liquid cooling parameters.

15. The system of claim 14, wherein the liquid cooling parameters include one or more of the following: a coolant temperature, a coolant flow rate, a fan speed, a pump speed, a power consumption rate, or an air temperature.

16. The system of claim 14, further comprising a network communication component configured to report at least a portion of the one or more liquid cooling parameters.

17. The system of claim 14, wherein the processor is configured to monitor the one or more liquid cooling parameters including by comparing at least one of the one or more liquid cooling parameters to one of: a threshold value, a desired range, or a specified state.

18. The system of claim 14, wherein the processor is further configured to automatically adjust a liquid cooling setting based on at least one of the one or more liquid cooling parameters.

19. A method, comprising:
storing a coolant in a first coolant reservoir at least in part included in a first data center rack;
using a first coolant pump to pump the coolant to a manifold configured to distribute the coolant to a plurality of different rack mounted devices included in a second data center rack different from the first data center rack but linked to the first data center rack, wherein the first data center rack includes a first coolant distribution unit including the first coolant pump and the first coolant reservoir, and wherein a third data center rack includes a second coolant distribution unit including a second coolant reservoir and a second coolant pump that is connected to the manifold configured to distribute the coolant to the different rack mounted devices included in the second data center rack, and the first coolant distribution unit of the first data center rack is configured to communicate with the second coolant distribution unit of the third data center rack via a data network to coordinate power efficiency of cooling duty shared at least between the first coolant distribution unit of the first data center rack and the second coolant distribution unit of the third data center rack, the first data center rack is different from the third data center rack; and
cooling the coolant using a heat exchanger configured to cool the coolant via an ambient air of a data center, wherein the heat exchanger is included inside a fixed external enclosure of the first data center rack as an open component without another enclosure surrounding the heat exchanger inside the fixed external enclosure of the first data center rack.

20. A data center rack, comprising:
a plurality of different data center racks, a first data center rack is different from a second data center rack;
a plurality of different rack mounted devices; and
a manifold configured to distribute a coolant to the plurality of different rack mounted devices;
wherein the manifold is configured to connect to:

a first data center rack of the different data center racks, the first data center rack including a first coolant distribution unit including a first coolant reservoir and a first coolant pump configured to pump the coolant to the manifold, wherein the first data center rack includes a heat exchanger configured to cool the coolant via an ambient air of a data center, and the heat exchanger is included inside a fixed external enclosure of the first data center rack as an open component without another enclosure surrounding the heat exchanger inside the fixed external enclosure of the first data center rack; and a second data center rack of the different data center racks, the second data center rack including a second coolant distribution unit including a second coolant reservoir and a second coolant pump configured to distribute the coolant to the plurality of different rack mounted devices, wherein the first coolant distribution unit of the first data center rack is configured to communicate with the second coolant distribution unit of the second data center rack via a data network to coordinate power efficiency of cooling duty shared at least between the first coolant distribution unit and the second coolant distribution unit.

* * * * *